(12) United States Patent
Said et al.

(10) Patent No.: US 12,288,586 B2
(45) Date of Patent: Apr. 29, 2025

(54) NON-VOLATILE MEMORY WITH SUB-PLANES HAVING INDIVIDUALLY BIASABLE SOURCE LINES

(71) Applicant: SanDisk Technologies LLC, Addison, TX (US)

(72) Inventors: Ramy Nashed Bassely Said, Dublin, CA (US); Jiahui Yuan, Fremont, CA (US); Lito De La Rama, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 310 days.

(21) Appl. No.: 17/952,857

(22) Filed: Sep. 26, 2022

(65) Prior Publication Data

US 2024/0105262 A1  Mar. 28, 2024

(51) Int. Cl.
| | | |
|---|---|---|
| G11C 16/04 | (2006.01) | |
| G06F 3/06 | (2006.01) | |
| G11C 16/08 | (2006.01) | |
| G11C 16/14 | (2006.01) | |
| G11C 16/26 | (2006.01) | |
| H01L 25/065 | (2023.01) | |

(52) U.S. Cl.
CPC ........ *G11C 16/0483* (2013.01); *G06F 3/0619* (2013.01); *G06F 3/0652* (2013.01); *G06F 3/0659* (2013.01); *G06F 3/0679* (2013.01); *G11C 16/08* (2013.01); *G11C 16/14* (2013.01); *G11C 16/26* (2013.01); *H01L 25/0657* (2013.01); *H01L 2225/06562* (2013.01)

(58) Field of Classification Search
CPC ... G11C 16/0483; G11C 16/24; G06F 3/0679; H01L 25/0657; H01L 2225/06562; H01L 2225/06506; H01L 2225/0651; H01L 2225/06541

See application file for complete search history.

(56) References Cited

U.S. PATENT DOCUMENTS

| | | | |
|---|---|---|---|
| 7,680,966 B1 * | 3/2010 | Falik | ................... H01L 25/0657 |
| | | | 711/170 |
| 9,236,131 B1 | 1/2016 | Yuan et al. | |
| 9,355,735 B1 | 5/2016 | Chen et al. | |
| 2019/0019558 A1 * | 1/2019 | Lee | ........................ H10B 43/10 |
| 2020/0381566 A1 * | 12/2020 | Rhie | ................. H01L 29/66833 |
| 2022/0254797 A1 | 8/2022 | Said et al. | |
| 2022/0254798 A1 | 8/2022 | Said et al. | |

* cited by examiner

*Primary Examiner* — Uyen Smet
(74) *Attorney, Agent, or Firm* — Pearl Cohen Zedek Latzer Baratz LLP

(57) ABSTRACT

To reduce data disturbs and lower current requirements of a 3D NAND memory die, a multi-block plane of non-volatile memory cells has its source line separated into multiple source line regions by introduction of isolation trenches. The plane structure for the NAND memory is maintained, but is broken into multi-block sub-planes, each with an independently biasable source line.

20 Claims, 18 Drawing Sheets

|             | S0 | S1 | S2 | S3 | S4 | S5 | S6 | S7 |
|-------------|----|----|----|----|----|----|----|----|
| Upper Page  | 1  | 1  | 1  | 0  | 0  | 0  | 0  | 1  |
| Middle Page | 1  | 1  | 0  | 0  | 1  | 1  | 0  | 0  |
| Lower Page  | 1  | 0  | 0  | 0  | 0  | 1  | 1  | 1  |

NON-VOLATILE MEMORY WITH SUB-PLANES HAVING INDIVIDUALLY BIASABLE SOURCE LINES

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a power source (e.g., a battery). One example of non-volatile memory is flash memory (e.g., NAND-type and NOR-type flash memory).

Important quantities of non-volatile memory include data capacity, speed of operation, data retention, and power consumption. These considerations are often at cross-purposes. For example, data capacity and speed of operation can be increased by use of denser physical structures, where more memory cells can be held in the same physical area of a memory device and higher degrees of parallelism can be used to provide higher read and write speeds; however, such structures frequently require higher current/power levels and are more prone to data disturbs, where an operation on one set of memory cells can adversely affect the quality of data stored in other sets of memory cells on a memory die.

BRIEF DESCRIPTION OF THE DRAWINGS

Like-numbered elements refer to common components in the different figures.

DETAILED DESCRIPTION

Technology is described herein for reducing levels of disturb and current consumption in non-volatile NAND memory. To increase memory density and parallelism of operations, NAND memory is typically formed of planes having a large number of blocks, which is the unit of erase in NAND memory. In a standard NAND memory architecture, such as for 3D NAND array where the NAND strings run vertically relative to the memory die's substrate, all blocks of a plane have a common set of control lines, including a shared source line used to bias the source end of the blocks' NAND strings. In an erase operation, the source line is set to a high erase voltage level to erase selected blocks. However, as this high voltage level is on the source line for all of the blocks of a plane, not just the erase-selected blocks, this can disturb the data stored on blocks that are not meant to be erased. Additionally, as the source line of the whole plane is biased for erase and other memory operations, this can result in high power consumption to provide the needed current levels. To reduce such disturbs and lower current requirements, the following introduces the use of sub-planes, where the plane structure for NAND memory is maintained, but the source line is separated into multiple source line regions by introduction of isolation trenches.

Figure 1:
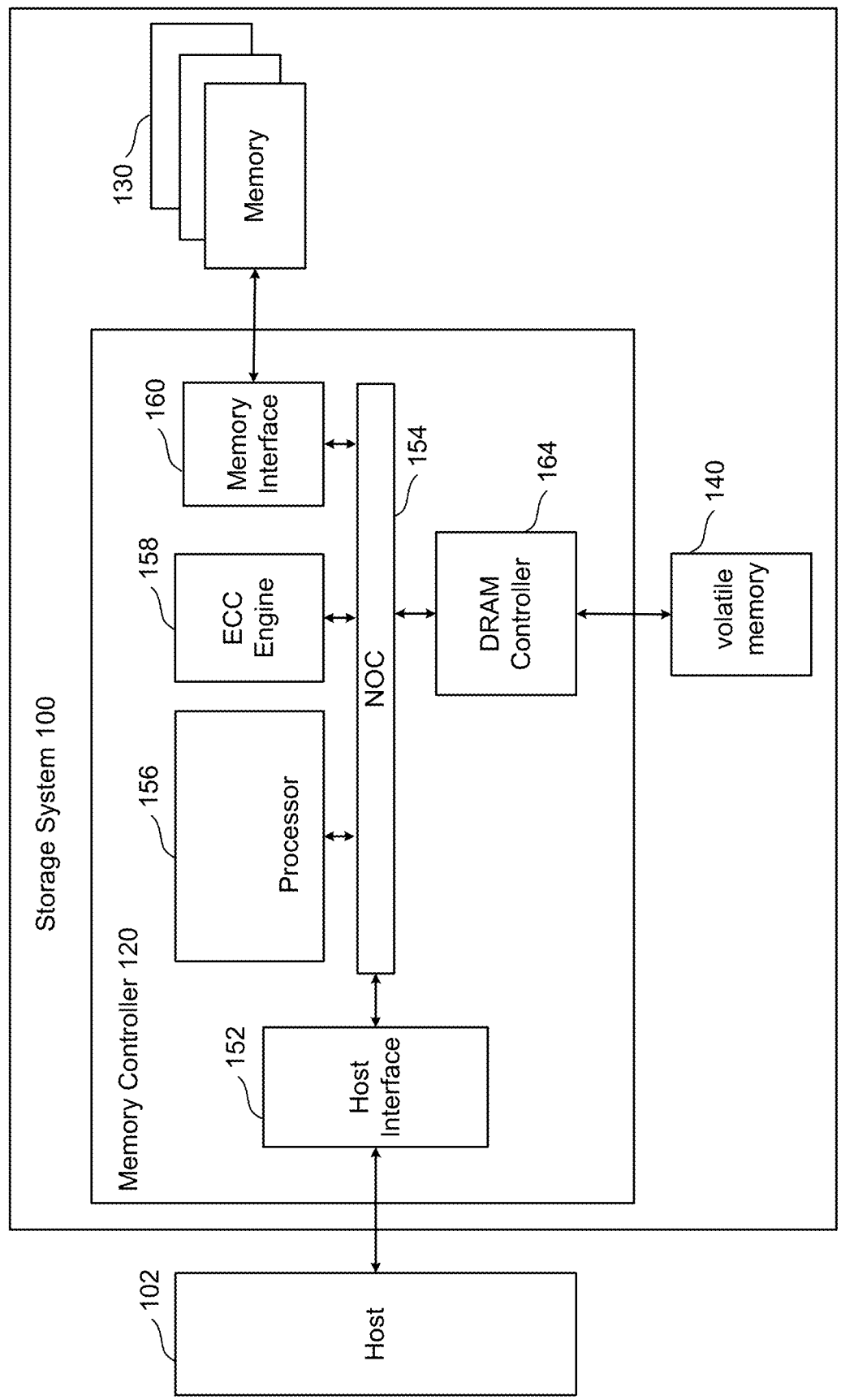
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
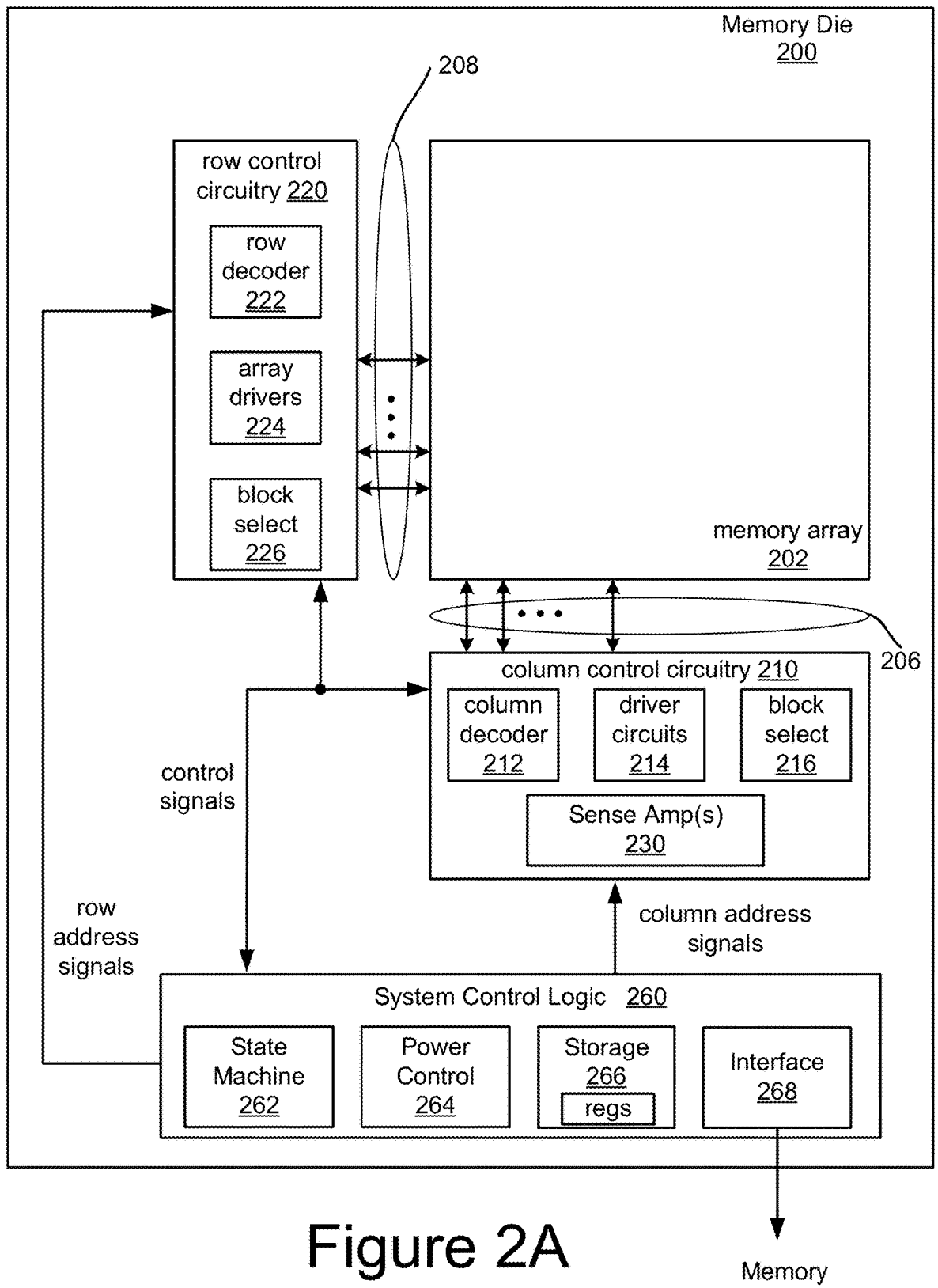
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
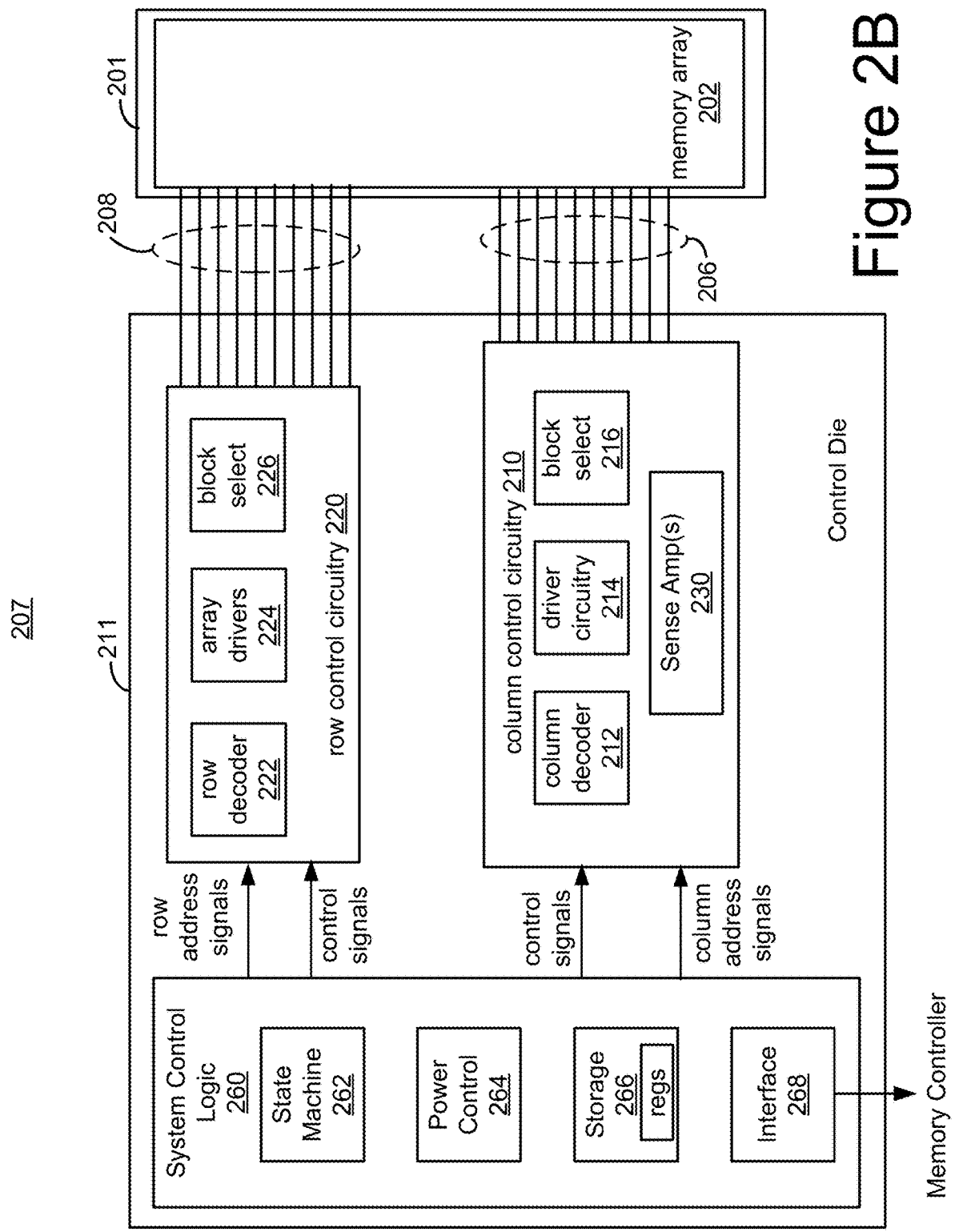
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrase "one or more control circuits" can include any one of or any combination of memory controller 120, state machine 262, all or a portion of system control logic 260, all or a portion of row contrail circuitry 200, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
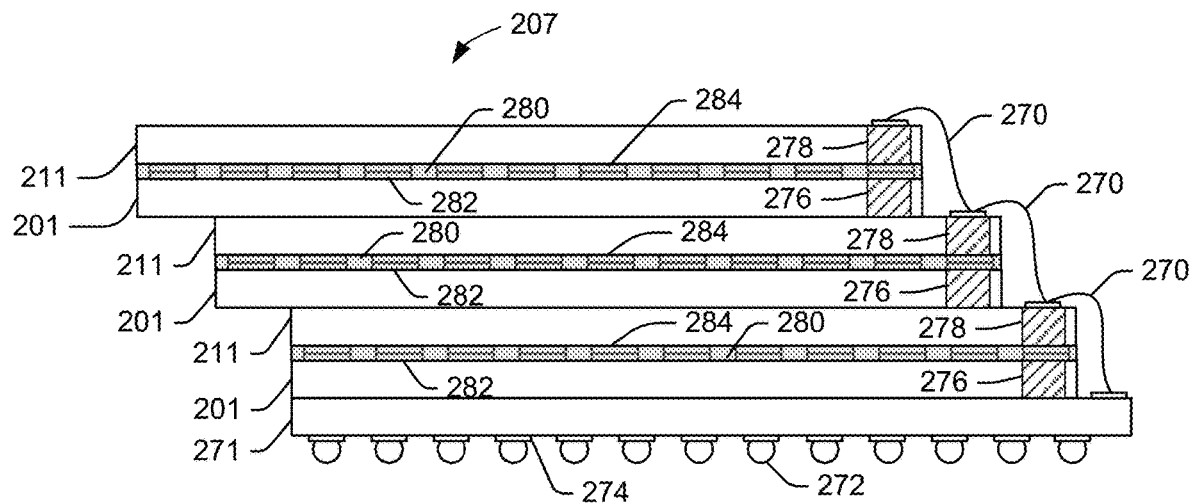
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
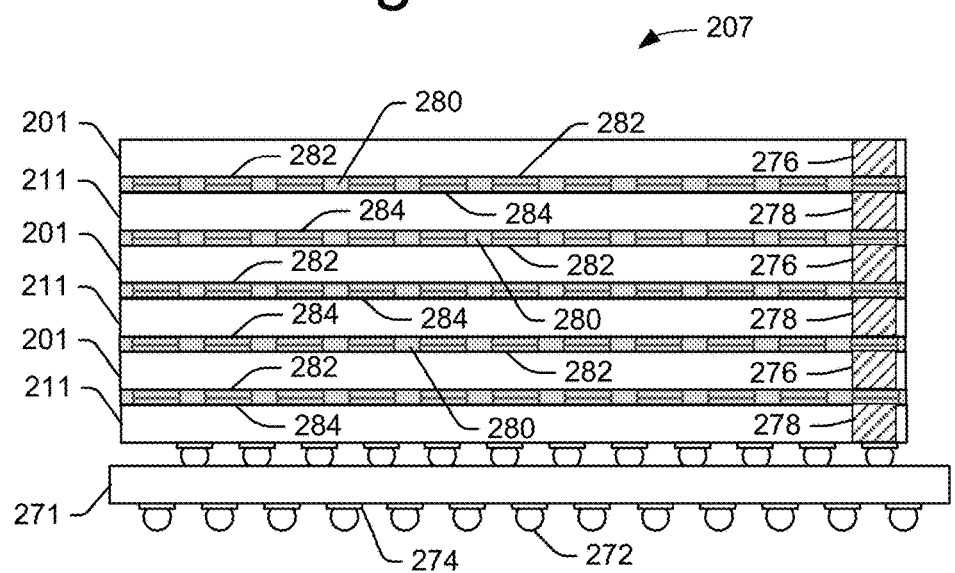

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
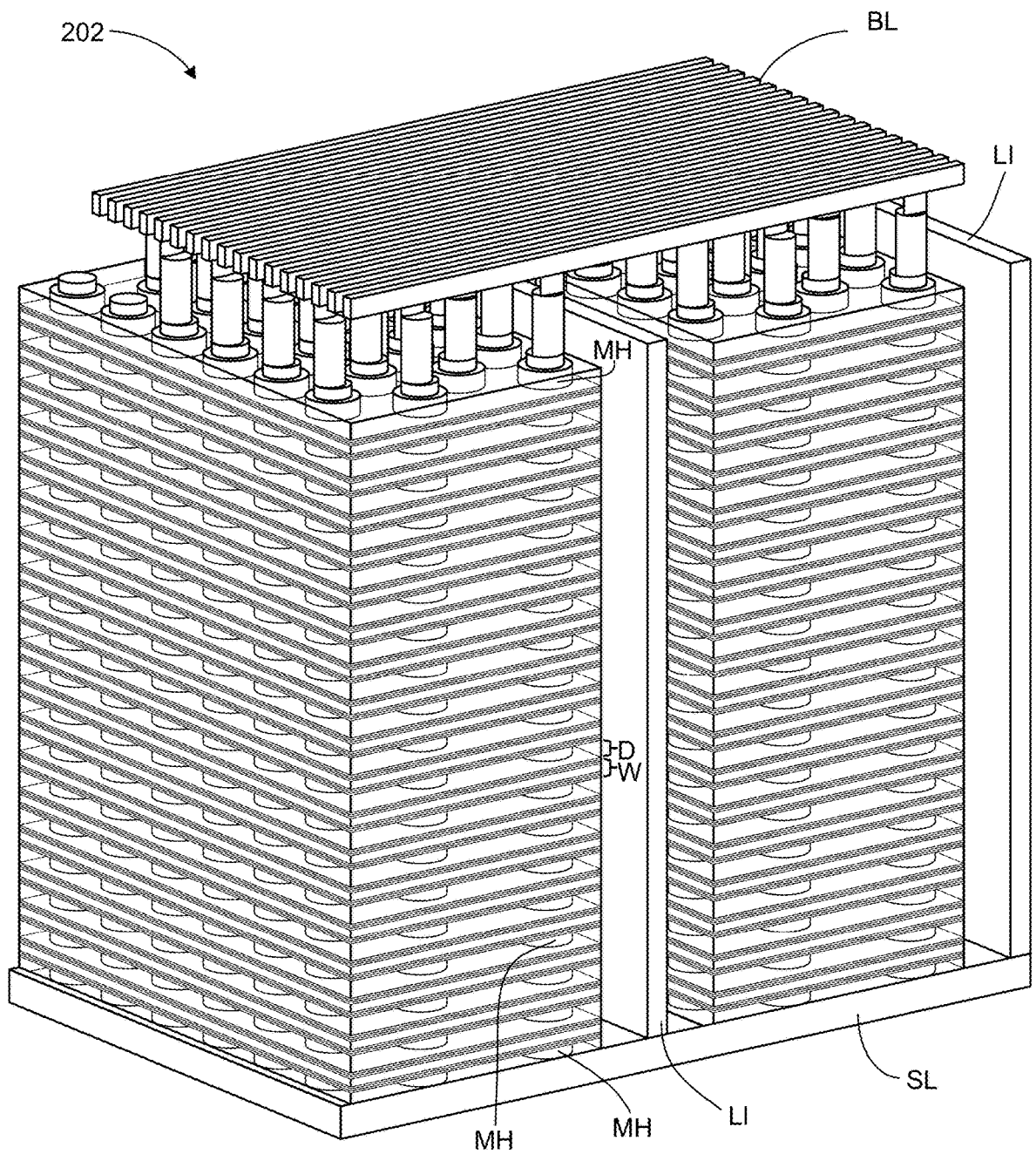
FIG. 3 is a perspective view of a portion of one embodiment of a monolithic three dimensional memory structure.

FIG. 3 is a perspective view of a portion of one example embodiment of a monolithic three dimensional memory array/structure that can comprise memory structure 202, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. More or less than 108-300 layers can also be used. As will be explained below, the alternating dielectric layers and conductive layers are divided into four or more regions (e.g., sub-blocks) by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below with respect to FIG. 4A-4E.

Figure 4A:
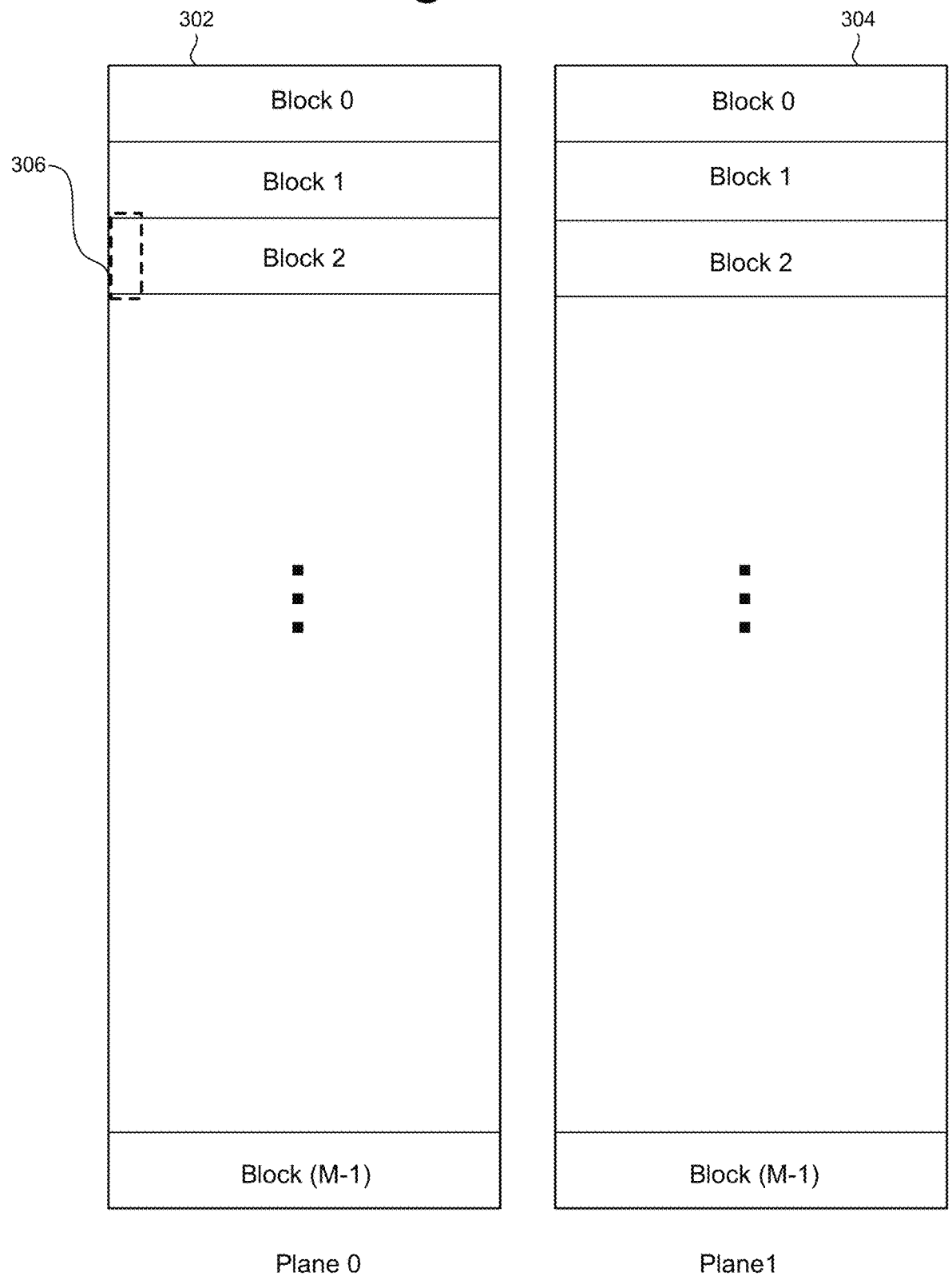
FIG. 4A is a block diagram of a memory structure having two planes.

FIG. 4A is a block diagram explaining one example organization of memory structure divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 302/304, more or less than two planes can be implemented. Ion some embodiments, memory structure 202 includes four planes.

Figure 4B:
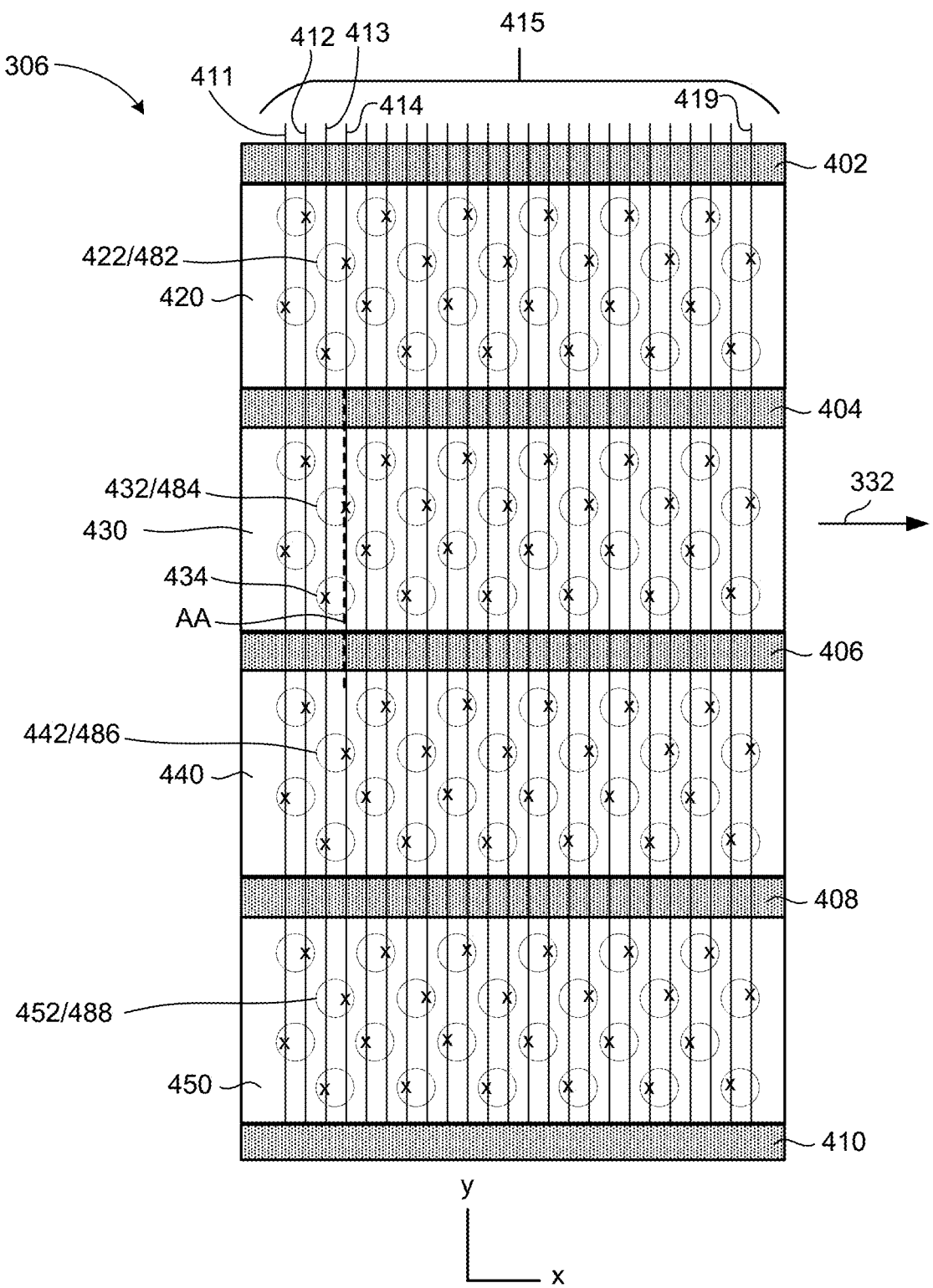
FIG. 4B depicts a top view of a portion of a block of memory cells.

FIGS. 4B-4E depict an example three dimensional ("3D") NAND structure that corresponds to the structure of FIG. 3 and can be used to implement memory structure 202 of FIGS. 2A and 2B. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
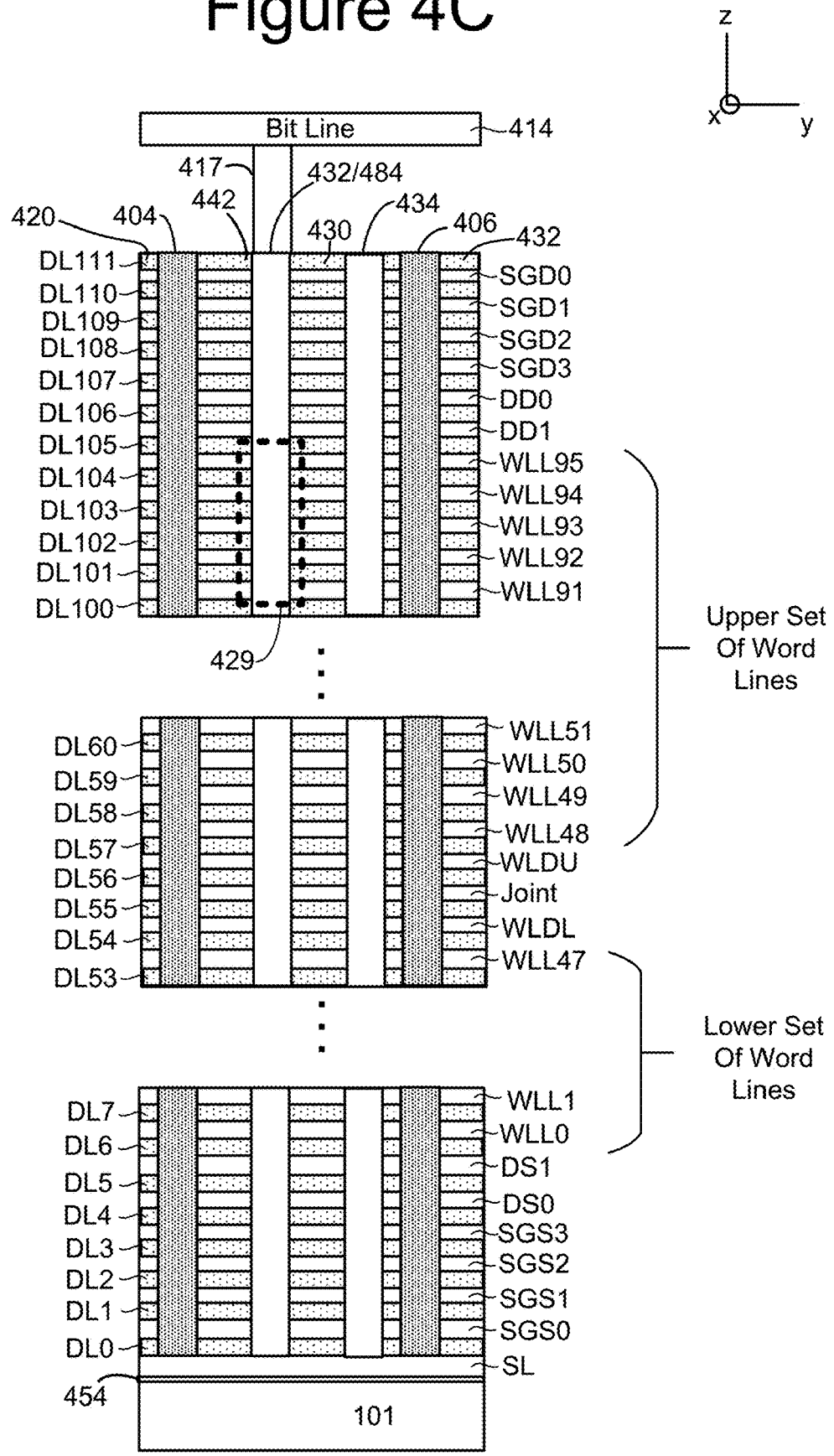
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and data word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

In one embodiment, drain side select layers SGD0, SGD1, SGD2 and SGD3 drain side selection lines; source side select layers SGS0, SGS1, SGS2 and SGS3 implement source side selection lines; dummy word line layers DD0, DD1, DS0, DS1, WLDL and WLDU implement dummy word lines; and data word line layers WLL0-WLL95 implement data word lines. In one embodiment, data word lines, dummy word lines, drain side selection lines and source side selection lines are all referred to generically as word lines.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (word lines are one example of control lines, bit lines can also be considered control lines) comprises a first stack of alternating word line layers and dielectric layers, a second stack of alternating word line layers and dielectric layers, and a joint area between the first stack and the second stack, as depicted in FIG. 4C.

Figure 4D:
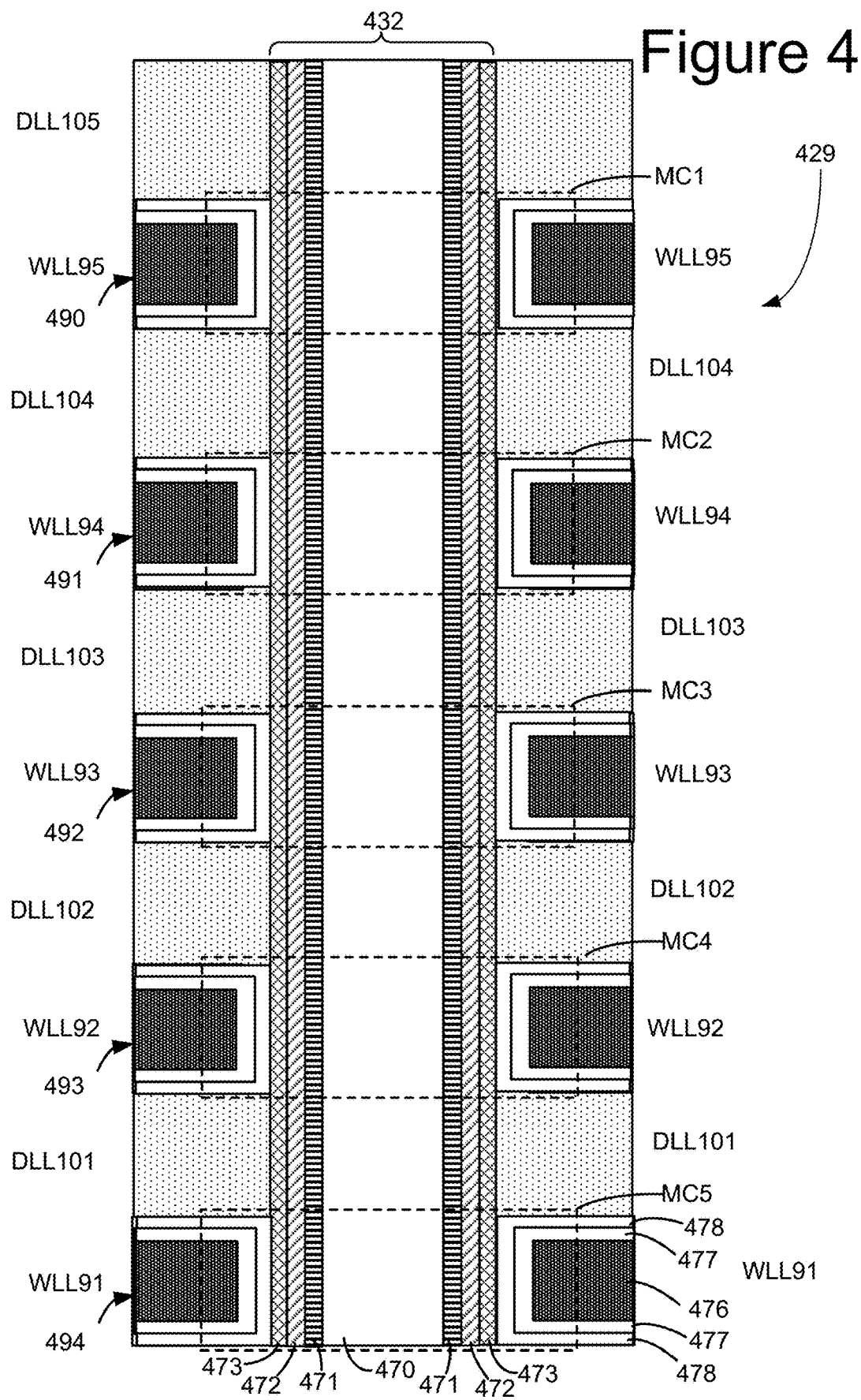
FIG. 4D is a cross sectional view of a vertical column of memory cells.

FIG. 4D depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4E:
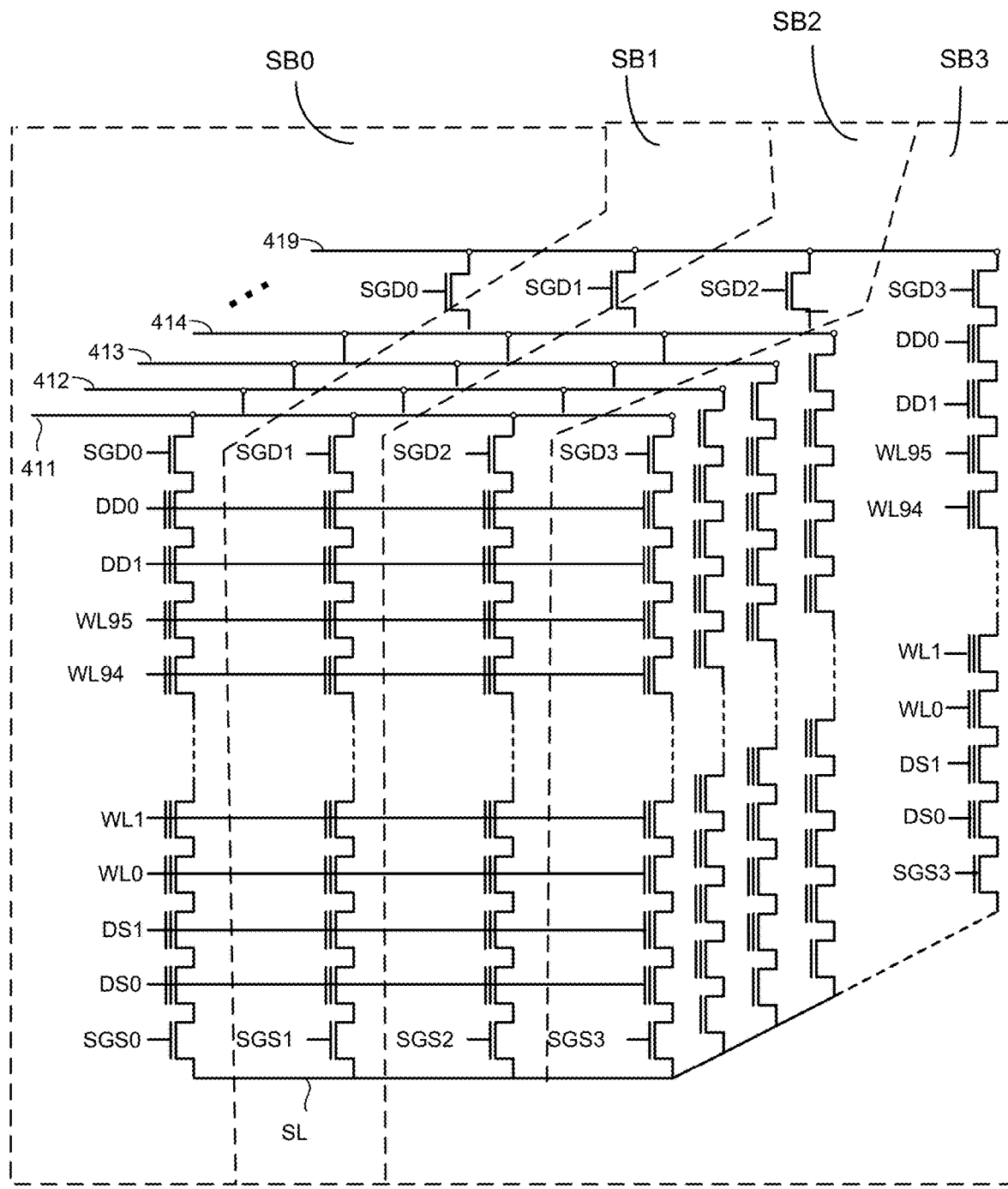
FIG. 4E is a schematic of a plurality of NAND strings showing multiple sub-blocks.

FIG. 4E is a schematic diagram of a portion of the memory depicted in in FIGS. 3-4D. FIG. 4E shows physical data word lines WLL0-WLL95 running across the entire block. The structure of FIG. 4E corresponds to portion 306 in Block 2 of FIGS. 4A-D, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4E is a three dimensional memory structure that includes vertical NAND strings with charge-trapping material, other (2D and 3D) memory structures can also be used with the technology described herein.

Figures 5, 6:
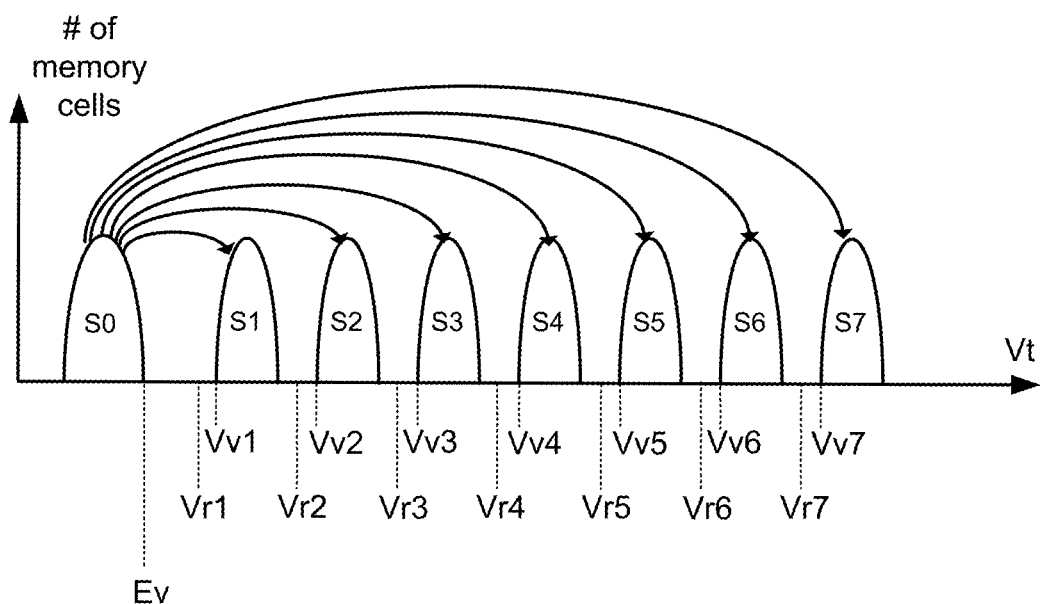
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 120 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7:
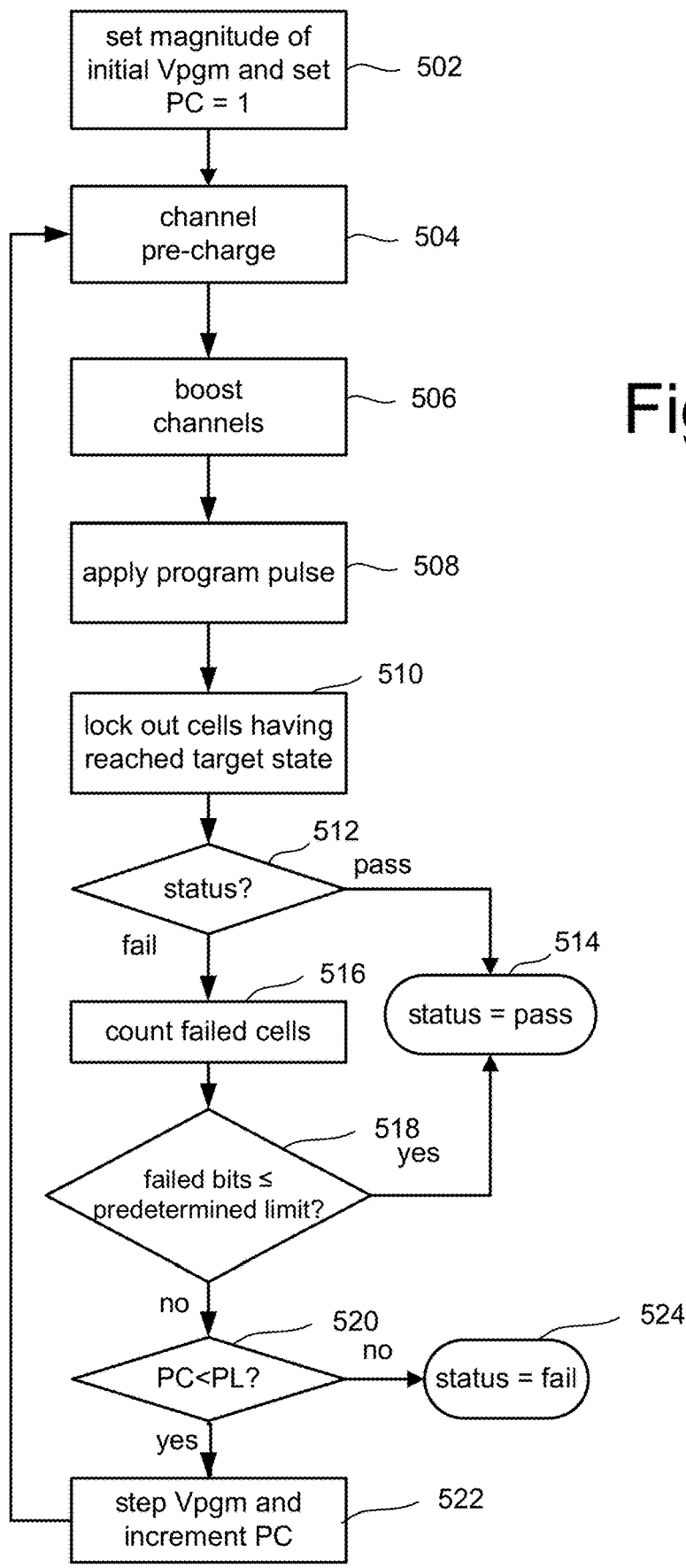
FIG. 7 is a flow chart describing one embodiment of a process for programming non-volatile memory.

FIG. 7 is a flowchart describing one embodiment of a process for programming that is performed by memory die 200 and/or integrated assembly 207. In one example embodiment, the process of FIG. 7 is performed on memory die 200 using the control circuitry (system control logic 260, column control circuitry 210, row control circuitry 220) discussed above. In one example embodiment, the process of FIG. 7 is performed by integrated memory assembly 207 using the control circuitry (system control logic 260, column control circuitry 210, row control circuitry 220) of control die 211 to program memory cells on memory die 201. The process includes multiple loops, each of which includes a program phase and a verify phase. The process of FIG. 7 is performed to implement the full sequence programming, as well as other programming schemes including multi-stage programming. When implementing multi-stage programming, the process of FIG. 7 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 502 of FIG. 7, the program voltage (Vpgm) is initialized to the starting magnitude (e.g., ~12-20V or another suitable level) and a program counter PC maintained by state machine 262 is initialized at 1.

In one embodiment, the set of memory cells selected to be programmed (referred to herein as the selected memory cells) are programmed concurrently and are all connected to the same data word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the storage system will pre-charge channels of NAND strings that include memory cells connected to the selected word line that are to be inhibited from programming. In step 506, NAND strings that include memory cells connected to the selected word line that are to be inhibited from programming have their channels boosted to inhibit programming. Such NAND strings are referred to herein as "unselected NAND strings." In one embodiment, the unselected data word lines receive one or more boosting voltages (e.g., ~7-11 volts) to perform boosting schemes. A program inhibit voltage is applied to the bit lines coupled the unselected NAND string.

In step 508, a program pulse (e.g., voltage pulse) of the program signal Vpgm is applied to the selected word line (the data word line selected for programming). If a memory cell on a NAND string should be programmed, then the corresponding bit line is biased at a program enable voltage, in one embodiment. Herein, such a NAND string is referred to as a "selected NAND string." In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state. If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all the memory cells have reached their target threshold voltages (fail), then the programming process continues to step 516.

In step 516, the system counts the number of memory cells that have not yet reached their respective target Vt distribution. That is, the system counts the number of memory cells that have, so far, failed to reach their target state. This counting can be done by the state machine 262, the memory controller 120, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for a page (e.g., the unit of programming and the unit of reading) of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a pro-rata (or other) portion of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 20 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, memory controller 120 receives host data (also referred to as user data or data from an entity external to the memory system), also referred to as information bits, that is to be stored non-volatile memory structure 202. The informational bits are represented by the matrix i=[1 0] (note that two bits are used for example purposes only, and many embodiments have code words longer than two bits). An error correction coding process (such as any of the processes mentioned above or below) is implemented by ECC engine 158 of memory controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21-28, Jan. 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of memory cells, but they do not need to be applied across multiple pages. The data bits can be mapped to a logical page and stored in memory structure 202 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 8:
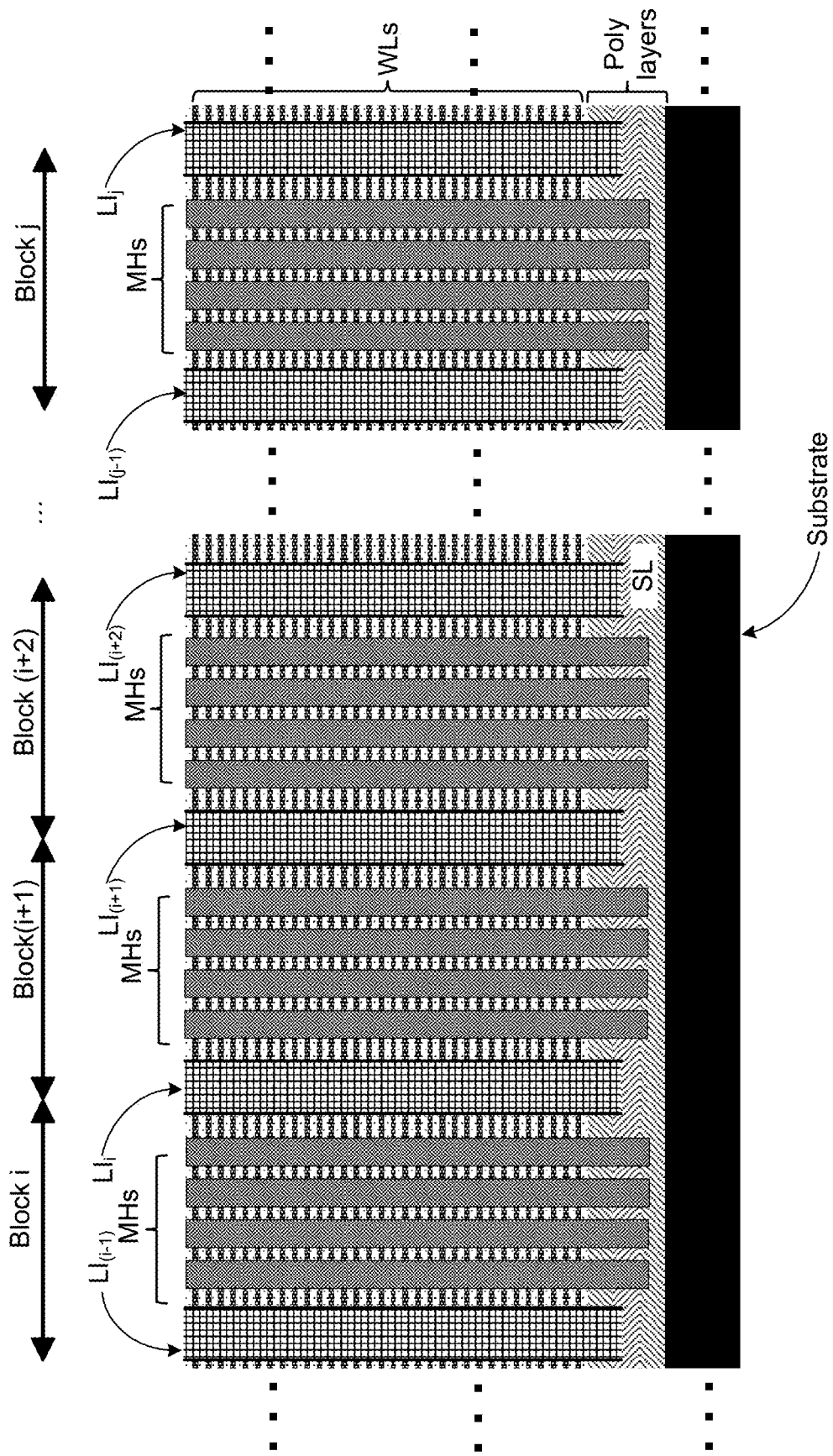
FIG. 8 is a side view of a portion of a plane of a 3D NAND memory array.

In a 3D NAND memory array, such as those discussed above with respect to FIGS. 3-4E, each of the multiple blocks of a plane as illustrated in FIG. 4A will be formed of vertical memory holes extending through multiple alternating word line and dielectric layers over a source line, which is in turn is formed over a substrate, as discussed above with respect to FIGS. 4B-4D. As represented schematically in FIG. 4E, the blocks of a plane are connected along word lines and global bit lines that span all of the blocks of the planes, with the individual NAND strings connected along the global bit lines. As illustrated in FIGS. 3 and 4A, all of the NAND strings of all of the blocks of the plane are also connected along the same source line SL. As illustrated in FIG. 3, this source is biased through the local interconnects LI that connect the source line SL of the block to the top of the 3D NAND structure so that they can be biased by the control circuitry of FIG. 2A or 2B. FIG. 8 presents an extended side view of this structure.

FIG. 8 is a side view of a portion of a plane of a 3D NAND array. This shows a number of blocks, each of which in this view has four visible memory holes (MTh) running vertically above the substrate. The memory holes run through multiple word line layers (WLs) separated by dielectric layers. The lower ends of the memory holes are connected to the source line that is formed by the poly layers running horizontally above the substrate. Consequently, the NAND strings of all of the different blocks, and fingers or sub-blocks, of a plane are connected to a shared source line. Since all of the blocks of a plane are connected to the same source line layer, the probability of erase disturb is greatly increased since the erase voltage is applied from the source line also applied to un-erase selected blocks whose word lines are left floating. In addition, a high memory die current ($I_{cc}$) is required to bias the source line to the erase voltage due to high resistive load coming from connecting all of the blocks together in this way. Another possible problem with this structure is that a short between the local interconnects and any one of the blocks can render the whole plane unusable since all of the local interconnects are interconnected through the source line structure of the poly layers.

To help reduce the amount of erase disturb and lower the current drawn in the memory operations of a plane, the source line of a block can be broken up into multiple regions, or sub-planes, by inserting isolation trenches every n blocks for some number of blocks, such as every n=16 blocks. Each of these groups of n blocks can be referred to as "sub-plane".

Figure 9:
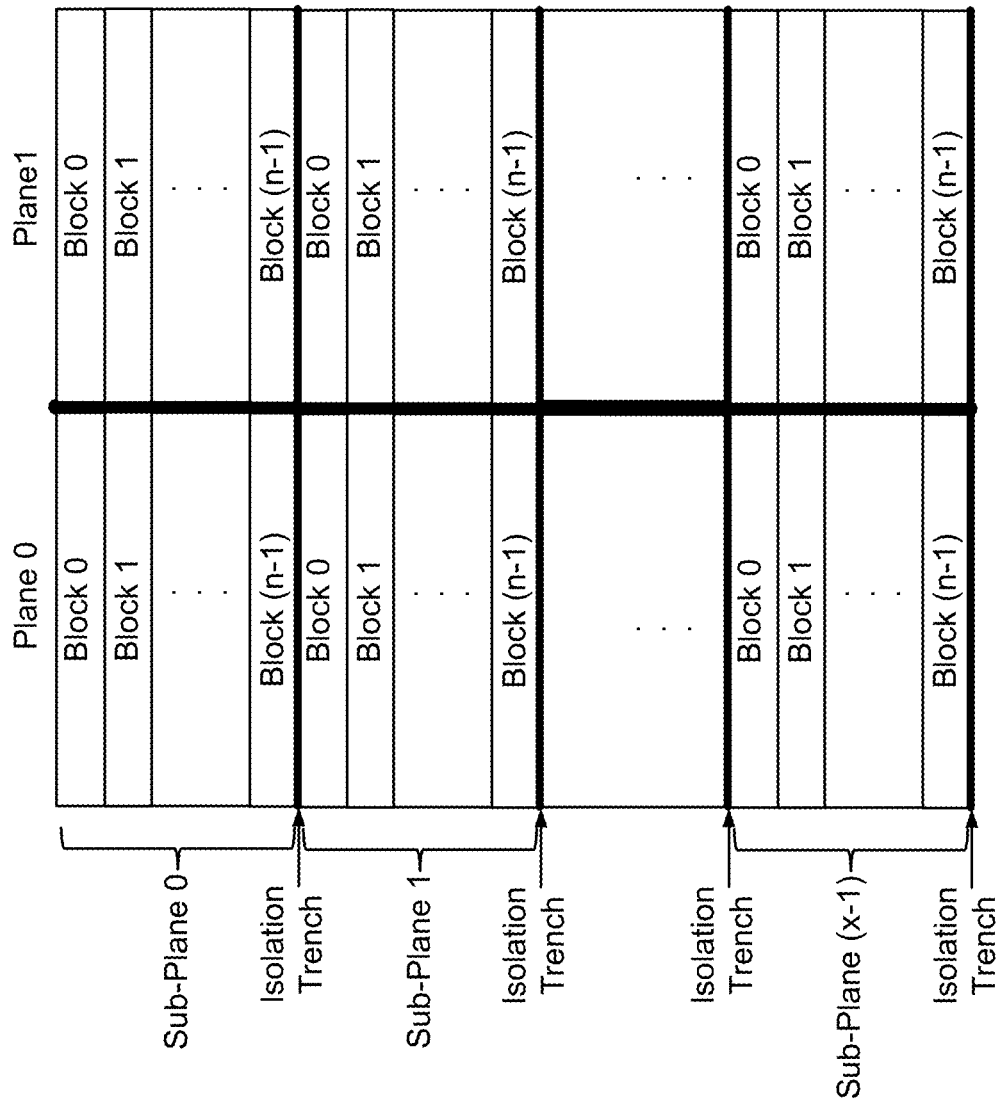
FIG. 9 is a block diagram of a two plane embodiment for a non-volatile memory structured similarly to FIG. 4A, but with the blocks of a plane separated into sub-planes by isolation trenches.

The word lines and global bit lines can still span the entire plane, but the source lines of the planes connected through the poly lanes at the bottom of the memory holes and connected to be biased through the local interconnects (LIs) are now broken down into sub-planes by isolation trenches, where the decoder circuitry of the memory die control circuitry of FIG. 2A or 2B can now add circuitry to select each sub-plane independently from other sub-planes when biasing the source lines. In one set of embodiments, the decoding circuitry used to separate the application of the erase or other source line voltage levels for a selected sub-plane can use the same signal from the block decoder used to address the high voltage switches for the word lines. FIG. 9 illustrates the sub-division of a plane into sub-plane through the use of isolation trenches.

FIG. 9 is a block diagram of a two plane embodiment for a non-volatile memory structured similarly to FIG. 4A, but with the blocks of a plane separated into sub-planes by isolation trenches. In FIG. 9 the heavier weight lines represent both the separation between the two planes (Plane 0, Plane 1) and also the isolation trenches that subdivide each of the planes into sub-planes. In this example, each of the sub-planes has n blocks for both planes, but more generally the sub-planes can be of non-uniform size, although this complicates decoding. Similarly, n can be a power of 2, such as 16, to simply addresses and decoding, although other sizes can be used. The selection of n is an engineering choice based on off-setting the advantages of a smaller sub-plane size against increased decoding. In this example, an n=16 embodiment is used.

Figure 10:
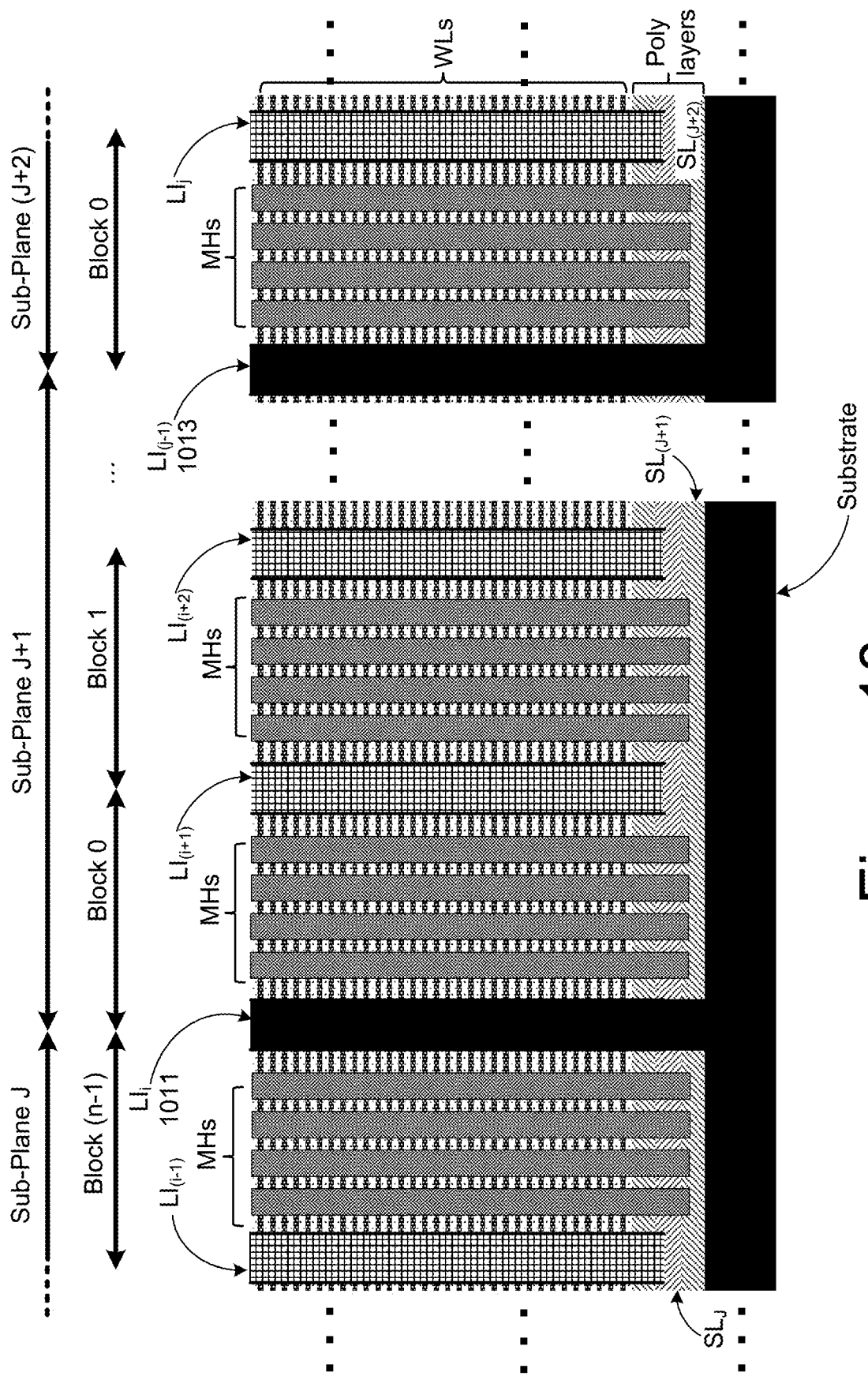
FIGS. 10 and 11 illustrate two sets of embodiments for isolating the source lines of blocks of a plane into sub-blocks.
Figure 11:
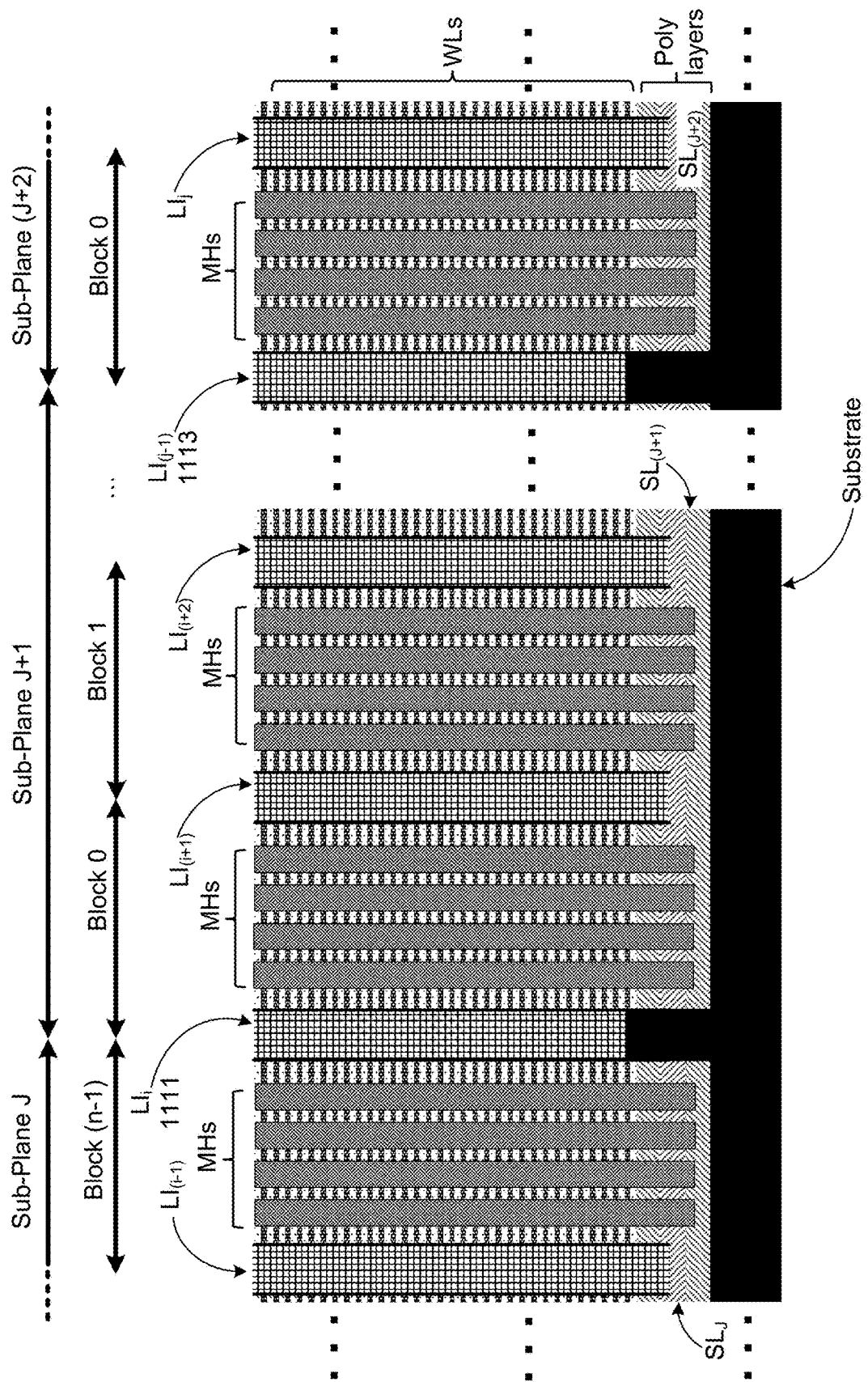

FIGS. 10 and 11 illustrate two sets of embodiments for isolating the source lines of blocks of a plane into sub-planes. These figures are laid out similarly to FIG. 8, but now the local interconnects (LIs) between the sub-planes no longer are connected to bias the source line (the Poly-layers). In both FIGS. 10 and 11, most of the local interconnects are formed of conductive material (represented as horizontal cross-hatching) such that they can apply a bias level to the poly-layers of the source lines as in FIG. 8, except now either the bottom portions or all of the trench formed for the local interconnect between sub-planes is now filled with a non-conductive dielectric as represented in full black in the figures. In the embodiment of FIG. 10, the whole of what would have been the local interconnect between each of the sub-plane (e.g., $LI_i$ 1011 and $LI_{(j-1)}$ 1013) is now filled with a non-conductive material such that the source line of the poly-layers between the blocks, such as sub-plane J and sub-plane (J+1), is no longer connected between the sub-planes.

In memory plane of FIG. 10 the local interconnects between sub-planes, such as $LI_i$ 1011 between sub-plane J and sub-plane J+1 or $LI_{(J-1)}$ 1013 between sub-plane J+1 and sub-plane (J+2), the whole of the trench down through the word line layers to the substrate is filled with dielectric, separating the source line of sub-plane J+1 from the source lines of sub-planes J and J+2. Within each sub-plane of adjacent, contiguous memory blocks, the source line voltage level can still be set by the other n−1 local interconnects, such as the shown $LI_{(i+1)}$ and $LI_{(i+2)}$ in sub-plane J+1. For the end blocks of the sub-plane, such a block 0 and block (n−1) (not shown in FIG. 10), as there is an active local interconnect to only side (e.g., only $LI_{(i+1)}$ for block 0) rather one to either side (e.g., $LI_{(i+1)}$ and $LI_{(i+2)}$ for block 1), in some embodiments different timing parameters can be used for end blocks to allow more time for the charging of the source line near the isolation trenches such as LL 1011.

Under the arrangement of FIG. 10, when a block in sub-plane J+1 is erased, only those block in those sub-plane J+1 will be subjected to the high erase voltage at their source, reducing erase disturbs in the other sub-planes. Less current will be used as only the source line of the one of the sub-planes needs to be charged, rather than the whole of the plane. Also, defects in the 3D NAND structures, such shorts between word lines and a local interconnect, that would otherwise render an entire plane to be defective can now be isolated to an individual sub-plane, that can be marked as defective while the remaining sub-plane are still usable. This isolation of defective sub-planes can be applied to both defects determined at test time when a device is new and also to grown defect that arise once the memory die is in use.

FIG. 11 illustrates another embodiment for introducing isolation trenches between the sub-planes of a plane of a 3D NAND memory device. FIG. 11 is arranged similarly to FIG. 10 and shows a side view of the same portion of a plane as FIG. 10. FIG. 11 differs from FIG. 10 in how the isolation trenches are formed. In the local interconnect trenches between sub-planes, such as $LI_i$ 1111 between sub-plane J and sub-plane J+1 and $LI_{(j-1)}$ 1113 between sub-plane J+1 and sub-plane J+2, only lower portion of the trench is filled with a dielectric (as represented in black) to be above the top of the poly layers of the source line region. The rest of the isolation trenches $LI_i$ 1111 and $LI_{(j-1)}$ 1113 running between the word line layers can be filed in with the same material as the other local interconnects. The arrangement of FIG. 11 can decrease processing time as the additionally filing with dielectric of the isolation trenches is not as deep, but does not as fully isolate the different sub-planes for the word lines or other layers of the array.

After the memory die are manufactured, they typically under a die sort process where they undergo various tests, including bad block detection using tests such as checking for word line to line interconnect leak detection. The sub-planes containing the bad blocks can then be identified and flag values for these can be set as part of the operation parameters of the memory die withing the registers (regs) in storage 266 of system control logic 260 of FIG. 2A or 2B. Both good and bad sub-planes can be erased using the same process; however, if an erase in a bad sub-plane leads to damage, only the sub-plane with the bad block or blocks will be affected as its source line is isolated from those of the other sub-planes. Another change due to the sub-plane structure is that edge blocks (next to isolation trench) may require longer timing parameters for source line ramping since the current to the source line is supplied from only a local interconnect on one side, rather than from both sides.

Figure 12B:
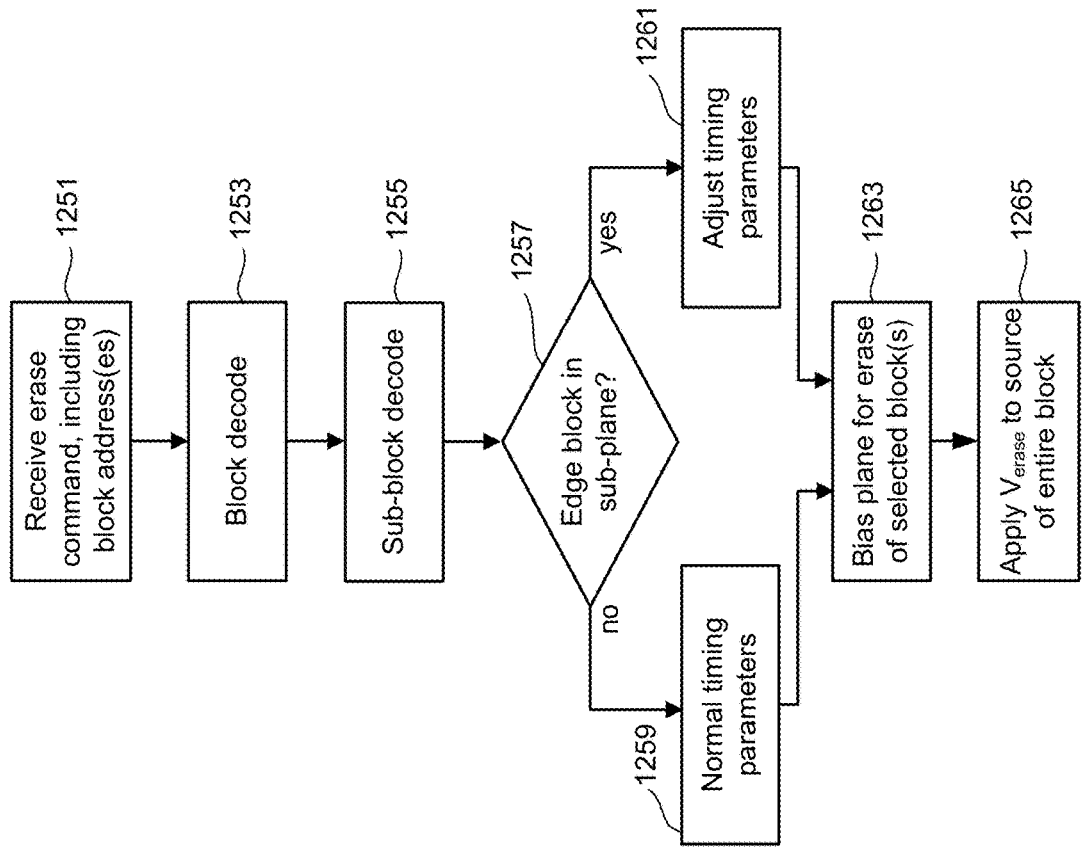
FIGS. 12A and 12B respectively consider an erase operation without the sub-plane structure and with the sub-plane structure.
Figure 12A:
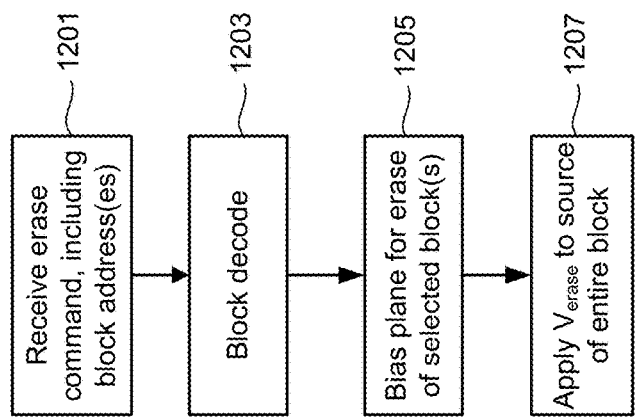

FIGS. 12A and 12B respectively consider an erase operation without the sub-plane structure and with the sub-plane structure. For the standard plane structure (without sub-planes), an erase process of FIG. 12A begins at step 1201 with receiving an erase command, including the address or addresses of one or more blocks of the memory die selected to be erased. The system control logic 260 can receive the erase command from the memory controller 120, where the erase command can either be a host command originating on host 102 or generated on the controller 120. Once the erase command is received by the control circuitry of system control logic 160, in step 1203 the command undergoes block decoding in the row control circuitry 220 and column control circuitry 210, such as block select 226. Once the selected block address is decoded, the plane is then biased for the erase of the erase selected one or more blocks in step 1205 by the row control circuitry 220 and column control circuitry 210, with the erase voltage level $V_{erase}$ then applied to the source line of the entire block at step 1207. The biasing of the array at step 1205 includes setting the voltage levels, whether to a specific voltage level or being left to float, for the word lines, select lines, and bit lines for an erase operation.

In the sub-block case of FIG. 12B, the erase command including the block address(es) are received at step 1251 and block decoded at step 1253, which can be as described with respect to step 1201 and step 1203 of FIG. 12A. Based on the sub-plane structure, at step 1255 the row control circuitry 220 and column control circuitry 210 perform a sub-plane decode, such as block select 226 determining the sub-plane to which the erase selected block or blocks belong. For embodiments where the edge blocks of a sub-plane, such block 0 of sub-plane J+1 in FIG. 10 or 11, use an adjusted timing, steps 1257, 1259, and 1261 follow. In step 1257, the system control logic 260 can determine whether an erase selected block is an edge block of a sub-plane and, if not, at step 1259 the normal timing parameters can be selected and used for the erase operation. If a selected block is an edge block, at step 1261 the adjusted erase timing parameters can be selected to allow more time for ramping up the sub-blocks select line to reach the erase voltage level $V_{erase}$. The actual erase then follows at steps 1263 and 1265, which can be as described above with respect to steps 1205 and 1207 of FIG. 12A, but with the timing set as in steps 1261 for embodiments that adjust the erase timing for edge blocks in a sub-plane. With the sub-block structure, the erase voltage is applied to the sub-plane of an erase selected block, but not the source lines of the other sub-block that can be left to float or biased at ground or other low level.

Figure 13B:
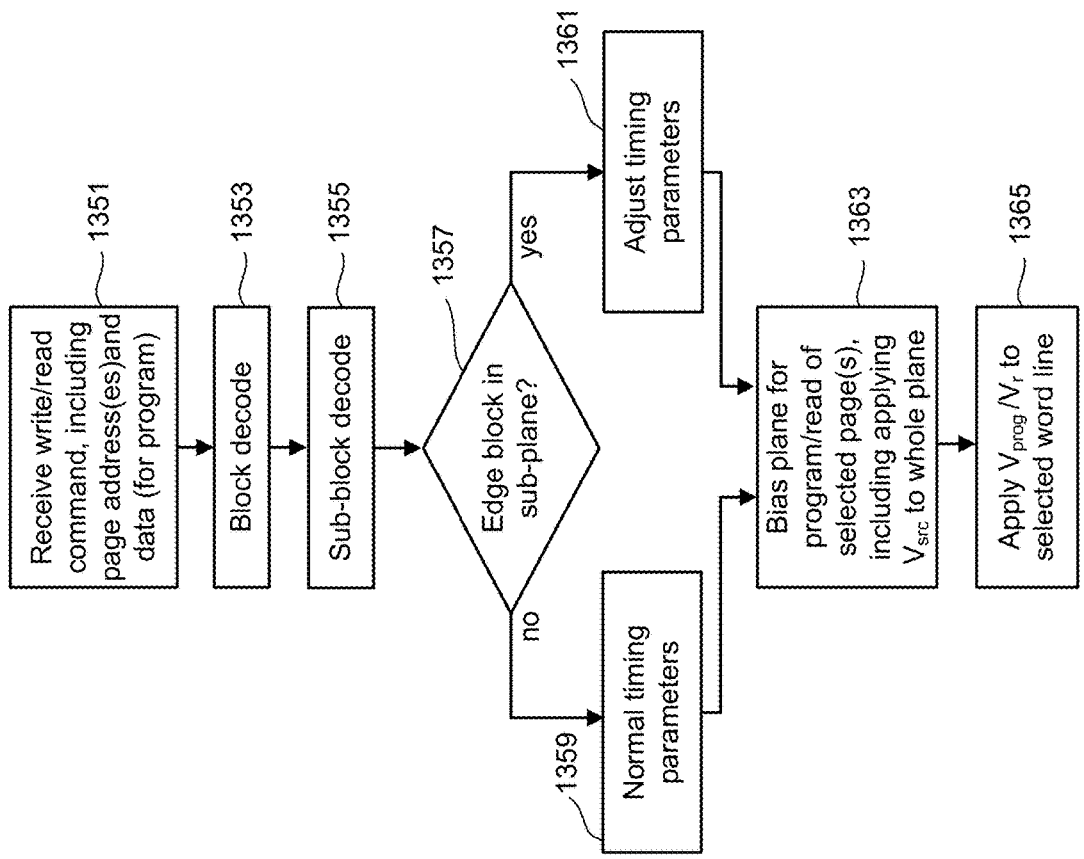
FIGS. 13A and 13B respectively consider a program or read operation without the sub-plane structure and with the sub-plane structure.
Figure 13A:
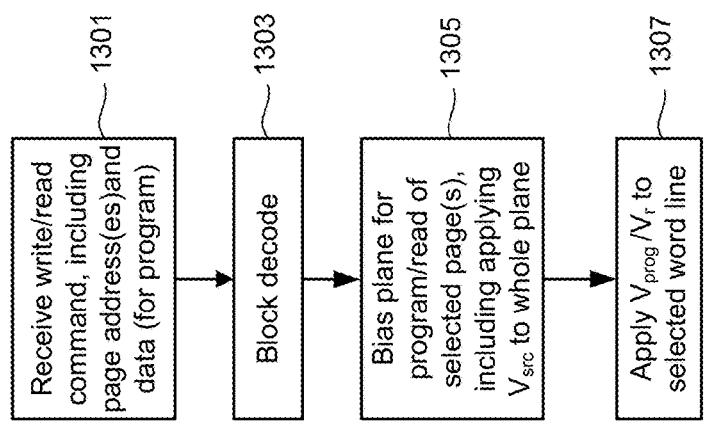

FIGS. 13A and 13B respectively consider a program or read operation without the sub-plane structure and with the sub-plane structure. For the standard plane structure (without sub-planes), a programming or read process of FIG. 13A begins at step 1301 with receiving a write or read command, including the page address or addresses of word lines of the memory die to be programmed or read, along with the data in the case of a write. The system control logic 260 can receive the program or read command from the memory controller 120, where the command can either be a host command originating on host 102 or generated on the controller 120, such as for housekeeping operations such as garbage collection or refresh. Once the program or read command is received by the control circuitry of system control logic 160, in step 1303 it then undergoes block decoding in the row control circuitry 220 and column control circuitry 210, such as block select 226. Once the block address is decoded, the plane is then biased for the program or read of the selected word lines in step 1305 by the row control circuitry 220 and column control circuitry 210. This includes biasing of the source line of the whole plane to the source line voltage level $V_{src}$ of the program or read. The value of $V_{src}$, and whether this is the same or different for write and read operations, can vary based on the embodiment. In some embodiments $V_{src}$ is ground, but in other embodiments $V_{src}$ is a low voltage somewhat above the ground level that can be regulated to be at a uniform voltage level when different amounts of current are being drained into the source line. The biasing of the array at step 1305 includes setting the voltage levels of the bit lines, the un-selected word lines, and select gates for the program or read, as well as setting the source line level for the plane. A programming pulse (in the case of a program operation) of $V_{pgm}$ or a read voltage (in the case of a data read) of $V_r$ is then applied to the selected word line at step 1307.

In the sub-block case of FIG. 13B, the program or write command, including page address and (for programming) data, is received at step 1351 and block decoded at step 1353, which can be as described with respect to step 1301 and step 1303 of FIG. 13A. Based on the sub-plane structure, at step 1355 the row control circuitry 220 and column control circuitry 210 perform a sub-plane decode, such as block select 226 determining the sub-plane to which the block or blocks belong of the selected pages belong. For embodiments where the edge blocks of a sub-plane, such block 0 of sub-plane J+1 in FIG. 10 or 11, use an adjusted timing, steps 1357, 1359, and 1361 follow. As the $V_{src}$ voltage level of a program or read operation is generally a fairly low value, particularly compared to the $V_{erase}$ level, the timing difference will likely be less pronounced than in the erase case of FIG. 12B if these steps are included. In step 1257, the system control logic 260 can determine whether a selected write or read page is an edge block of a sub-plane and, if not, at step 1359 the normal timing parameters can be selected and used for the erase operation. If a selected page is in an edge block, at step 1361 the adjusted erase timing parameters can be selected to allow more time for ramping up the sub-blocks select line to reach the $V_{src}$ voltage level. The write or read then follows at steps 1363 and 1365, which can be as described above with respect to steps 1305 and 1307 of FIG. 13A, but with the timing set as in steps 1361 for embodiments that adjust the timing for edge blocks in a sub-plane. With the sub-block structure, the $V_{src}$ voltage level is applied to the sub-plane of a read or write selected block, but not the source lines of the other sub-block that can be left to float or biased at ground or other low level.

One embodiment includes a non-volatile memory device, comprising a control circuit configured to connect to an array of non-volatile memory cells having a NAND architecture, the array including a plane of a plurality of blocks of NAND strings connected along a plurality of word lines and each NAND string connected to one of a plurality of bit lines, the plane comprising a plurality of sub-planes each having a plurality of blocks whose NAND strings are connected to a corresponding individually biasable source line. The control circuit is configured to: receive a command to access a selected plurality of memory cells of a selected block; bias the word lines and bit lines of the plane to access the selected memory cells; determine the sub-plane to which the selected block belongs; and bias the source line of the determined sub-plane, but not other sub-planes of the plane, to access the selected memory cells.

One embodiment includes a method for comprising: receiving a command to access a selected plurality of memory cells of a selected block of a plane of an array of non-volatile memory cells, the array of non-volatile memory cells having a NAND architecture and the plane including a plurality of blocks of NAND strings connected along a plurality of word lines and each NAND string connected to one of a plurality of bit lines, the plane comprising a plurality of sub-planes each having a plurality of blocks whose NAND strings are connected to a corresponding individually biasable source line; biasing the word lines and bit lines of the plane to access the selected memory cells; determining the sub-plane to which the selected block belongs; and biasing the source line of the determined sub-plane, but not other sub-planes of the plane, to access the selected memory cells.

One embodiment includes a non-volatile storage apparatus comprising an array of non-volatile memory cells. The array of non-volatile memory cells comprises: a plane comprising a plurality of blocks, each of the blocks having a plurality of NAND strings of a plurality of the memory cells running vertically relative to a horizontal substrate; a plurality of word lines along which memory cells of the NAND strings of the plane are connected; a plurality of bit lines, each of the NAND strings of the plane connected one of the bit lines; a source line layer running horizontally over the substrate and to which the NAND strings are connected; and one or more isolation regions separating the source line layer into a plurality of individually biasable source lines, each of the source lines corresponding to a multi-block sub-plane of the plane.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   an array of non-volatile memory cells having a NAND architecture, including:
      a plurality of word lines;
      a plurality of bit lines;
      a plurality of individually biasable source lines;
      a plane of a plurality of blocks of NAND strings connected along the plurality of word lines and each NAND string connected to one of the plurality of bit lines, the plane comprising a plurality of sub-planes each having a plurality of blocks whose NAND strings are connected to a corresponding one of a plurality of individually biasable source lines, the array having a three dimensional architecture in which the NAND strings run vertically relative to a horizontal substrate, the source lines of the sub-planes run horizontally over the substrate and below the NAND strings, and the source line of each of the sub-planes separated from the source lines of others of the sub-plane by isolation regions extending vertically between the source lines of the sub-planes and through the plurality of word lines of the plane; and
      for each sub-plane, one or more corresponding interconnects each connected to the corresponding source line of the sub-plane and each extending vertically between word lines of a pair of blocks of the sub-plane and configured to connect above the NAND strings to receive a bias level; and
   a control circuit configured to connect to the plurality of word lines, the plurality of bit lines, and the interconnects, the control circuit configured to:
      receive a command to access a selected plurality of memory cells of a selected block;
      bias the word lines and bit lines of the plane to access the selected memory cells;
      determine the sub-plane to which the selected block belongs; and
      bias the source line of the determined sub-plane, but not other sub-planes of the plane, through the corresponding interconnects to access the selected memory cells.

2. The non-volatile memory device of claim 1, wherein the control circuit is on a control die and the array off non-volatile memory cells is on a memory die separate from and bonded to the control die.

3. The non-volatile memory device of claim 1, wherein:
   the command to access the selected plurality of memory cells of the selected block is an erase command;
   the selected plurality of memory cells is all of the memory cells of the selected block; and
   to bias the source line of the determined sub-plane the control circuit is further configured to:
      apply an erase voltage level to the source line of the determined sub-plane.

4. The non-volatile memory device of claim 1, wherein:
   the command to access the selected plurality of memory cells of the selected block is a read command; and
   the selected plurality of memory cells is a page of memory cells of the selected block.

5. The non-volatile memory device of claim 4, wherein, to bias the word lines of the plane to access the selected memory cells, the control circuit is further configured to:
   apply a read voltage level to a word line of the plane corresponding to the page of memory cells.

6. The non-volatile memory device of claim 1, wherein:
   the command to access the selected plurality of memory cells of the selected block is a program command; and
   the selected plurality of memory cells is a page of memory cells of the selected block.

7. The non-volatile memory device of claim 6, wherein:
   the command to access the selected plurality of memory cells of the selected block includes data to be written to the page of memory cells of the selected block.

8. The non-volatile memory device of claim 6, wherein, to bias the word lines of the plane to access the selected memory cells, the control circuit is further configured to:
   apply a programming pulse to a word line of the plane corresponding to the page of memory cells.

9. A method, comprising:
   receiving a command to access a selected plurality of memory cells of a selected block of a plane of an array of non-volatile memory cells, the array of non-volatile memory cells having a NAND architecture and the plane including a plurality of blocks of NAND strings connected along a plurality of word lines and each NAND string connected to one of a plurality of bit lines, the plane comprising a plurality of sub-planes each having a plurality of blocks whose NAND strings are connected to a corresponding individually biasable source line, the array having a three dimensional architecture in which the NAND strings run vertically relative to a horizontal substrate, the source lines of the sub-planes run horizontally over the substrate and below the NAND strings, and the source line of each of the sub-planes separated from the source lines of others of the sub-plane by isolation regions extending vertically between the source lines of the sub-planes and through the plurality of word lines of the plane and, for each sub-plane, one or more corresponding interconnects each connected to the corresponding source line of the sub- plane and each extending vertically between word lines of a pair of blocks of the sub-plane and configured to connect above the NAND strings to receive a bias level;

biasing the word lines and bit lines of the plane to access the selected memory cells;

determining the sub-plane to which the selected block belongs; and biasing the source line of the determined sub-plane, but not other sub-planes of the plane, through the corresponding interconnects to access the selected memory cells.

10. The method of claim 9, wherein the command to access the selected plurality of memory cells of the selected block is an erase command, the selected plurality of memory cells is all of the memory cells of the selected block, and biasing the source line of the determined sub-plane the control circuit comprises:

applying an erase voltage level to the source line of the determined sub-plane.

11. The method of claim 9, wherein the selected plurality of memory cells of the selected block, the command to access the selected plurality of memory cells of the selected block is a program command and includes data to be written to the page of memory cells of the selected block, and biasing the word lines of the plane to access the selected memory cells comprises:

applying a programming pulse to a word line of the plane corresponding to the page of memory cells.

12. The method of claim 9, wherein the command to access the selected plurality of memory cells of the selected block is a read command, the selected plurality of memory cells is a page of memory cells of the selected block, and biasing the word lines of the plane to access the selected memory cells comprises:

applying a read voltage level to a word line of the plane corresponding to the page of memory cells.

13. A non-volatile memory device, comprising:
an array of non-volatile memory cells, comprising:
a plane comprising a plurality of blocks, each of the blocks having a plurality of NAND strings of a plurality of the memory cells running vertically relative to a horizontal substrate;
a plurality of word lines along which memory cells of the NAND strings of the plane are connected;
a plurality of bit lines, each of the NAND strings of the plane connected one of the bit lines;
a source line layer comprising a plurality of individually biasable source line regions running horizontally over the substrate below the NAND strings and to which the NAND strings are connected, the plane comprising a plurality of sub-planes each having a plurality of blocks whose NAND strings are connected to a corresponding one of a plurality of individually biasable source line regions, the array having a three dimensional architecture in which the NAND strings run vertically relative to a horizontal substrate, and the source line region of each of the sub-planes separated from the source line regions of others of the sub-plane by isolation regions separating extending vertically between the source lines of the sub-planes and through the plurality of word lines of the plane; and for each sub-plane, one or more corresponding interconnects each connected to the corresponding source line of the sub-plane and each extending vertically between word lines of a pair of blocks of the sub-plane and configured to connect above the NAND strings to receive a bias level.

14. The non-volatile memory device of claim 13, further comprising:

one or more control circuits configured to:
access a selected plurality of memory cells of a selected block, wherein access the selected plurality of memory cells the one or more control circuits are configured to bias the source line of the sub-plane to which the selected block belongs, but not the source line of other sub-planes of the plane.

15. The non-volatile memory device of claim 14, wherein the array is on a memory die and the one or more control circuits formed on the memory die.

16. The non-volatile memory device of claim 14, wherein the selected plurality of memory cells of the selected block are accessed for an erase command, the selected plurality of memory cells is all of the memory cells of the selected block, and, to bias the source line of the determined sub-plane the control circuit is further configured to:

apply an erase voltage level to the source line of the determined sub-plane.

17. The non-volatile memory device of claim 14, wherein the selected plurality of memory cells of the selected block are accessed for a read command and the selected plurality of memory cells is a page of memory cells of the selected block.

18. The non-volatile memory device of claim 17, wherein, to bias the word lines of the plane to access the selected memory cells, the control circuit is further configured to:

apply a read voltage level to a word line of the plane corresponding to the page of memory cells.

19. The non-volatile memory device of claim 14, wherein the selected plurality of memory cells of the selected block are accessed for a program command and the selected plurality of memory cells is a page of memory cells of the selected block.

20. The non-volatile memory device of claim 14, wherein the array is on a memory die and the non-volatile memory device further comprises:

a control die separate from and bonded to the memory die and including the one or more control circuits.

* * * * *